United States Patent
Park et al.

(10) Patent No.: US 7,551,480 B2
(45) Date of Patent: Jun. 23, 2009

(54) MULTI-BIT FLASH MEMORY DEVICE AND MEMORY CELL ARRAY

(75) Inventors: Ki-Tae Park, Seongnam-si (KR); Ki-Nam Kim, Seoul (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 216 days.

(21) Appl. No.: 11/637,791

(22) Filed: Dec. 13, 2006

(65) Prior Publication Data

US 2008/0062763 A1 Mar. 13, 2008

(30) Foreign Application Priority Data

Sep. 13, 2006 (KR) .................. 10-2006-0088705

(51) Int. Cl.
G11C 11/34 (2006.01)

(52) U.S. Cl. ............... 365/185.11; 365/185.17; 365/185.33; 365/230.08

(58) Field of Classification Search ............ 365/185.11, 365/185.17, 185.33, 230.08
See application file for complete search history.

(56) References Cited

U.S. PATENT DOCUMENTS

| | | | |
|---|---|---|---|
| 6,584,012 B2 | 6/2003 | Banks | |
| 6,594,178 B2 * | 7/2003 | Choi et al. | 365/185.17 |
| 6,717,857 B2 * | 4/2004 | Byeon et al. | 365/185.21 |
| 6,735,124 B1 | 5/2004 | Melik-Martirosian et al. | |
| 6,751,124 B2 * | 6/2004 | Lee | 365/185.18 |
| 6,807,095 B2 | 10/2004 | Chen et al. | |
| 7,327,606 B2 * | 2/2008 | Lee | 365/185.17 |

FOREIGN PATENT DOCUMENTS

| | | |
|---|---|---|
| JP | 2001-006374 | 1/2001 |
| KR | 10-1997-0051356 | 7/1997 |
| KR | 10-1999-013057 | 2/1999 |

* cited by examiner

*Primary Examiner*—Pho M. Luu
(74) *Attorney, Agent, or Firm*—Volentine & Whitt, PLLC

(57) ABSTRACT

A flash memory device comprises a plurality of memory blocks. A selected memory block among the plurality of memory blocks includes $2^n$ pages of data. The selected memory block includes different types of memory cells capable of storing different numbers of bits.

22 Claims, 16 Drawing Sheets

Fig. 5

| Page/Block | 64 | | 128 | | | | 256 | | |
|---|---|---|---|---|---|---|---|---|---|
| Dummy Cell | | | | | 2 | | | 1 | 2 |
| 1 bit/Cell (2-level SLC) | 2 →2 | | | 1 | 1 | | | →1 | →1 |
| 1.5 bit/Cell (3-level SLC) | 20 →20 | | 42 | 1 | 1 | | →1 | →1 | |
| 2 bit/Cell (4-level MLC) | | 2 | | 42 | 42 | 2 | | | |
| 2.5 bit/Cell (6-level MLC) | | 24 | 43 | | | 50 | 42 | 42 | 42 |
| 3 bit/Cell (8-level MLC) | 22 | 26 | | 44 | 45 | 52 | 43 | 44 | 45 |
| # of cell in string (본발명) | 32 | | | | | | | | |
| # of cell in string (종래기술) | | | | | 64 | | | | |

ున

MULTI-BIT FLASH MEMORY DEVICE AND MEMORY CELL ARRAY

BACKGROUND OF THE INVENTION

1. Field of the Invention

Embodiments of the invention relate generally to semiconductor memory devices. More particularly, embodiments of the invention relate to multi-bit flash memory devices and memory cell arrays for the multi-bit flash memory devices.

A claim of priority is made to Korean Patent Application No. 2006-88705, filed on Sep. 13, 2006, the disclosure of which is hereby incorporated by reference in its entirety.

2. Description of Related Art

Semiconductor memory devices can be roughly classified into volatile and nonvolatile semiconductor memory devices. Volatile memory devices allow high speed read and write operations, but lose data when disconnected from an external power source. On the other hand, nonvolatile memory devices retain stored information even when disconnected from an external power source.

Because of their ability to retain stored data when disconnected from an external power source, nonvolatile memory devices are commonly used in applications where power is limited or may be lost unexpectedly. Some common examples of nonvolatile memory devices include masked read-only memory (MROM), programmable ROM (PROM), erasable and programmable ROM (EPROM), and electrically erasable and programmable ROM (EEPROM).

In general, it is difficult to update stored information in nonvolatile memory devices such as MROM, PROM and EPROM. However, EEPROMs can be efficiently erased and programmed through electrical means. As a result, EEPROMS are widely employed in applications such as portable electronic devices or system components requiring relatively frequent data updates.

Flash memory is one common form of EEPROM. Flash memory offers relatively high density data storage compared with many conventional EEPROMs, and as a result, flash memory can provide large amounts of data storage in subsidiary memory systems or in portable devices. Among flash memories, NAND-type flash EEPROMs, also called NAND flash memories, provide exceptionally dense data storage.

FIG. 1 is a memory block diagram illustrating a conventional flash memory device. Referring to FIG. 1, the flash memory device includes a memory cell array 10, a row decoder 20, and a page buffer circuit 30. Memory cell array 10 comprises a plurality of memory cell memory blocks. Each memory cell memory block includes a plurality of memory cell strings, referred to as hereafter as "NAND strings". Each NAND string comprises a plurality of floating gate transistors M0 through Mn-1 functioning as memory cells. As an example, FIG. 1 shows NAND strings included in a single memory cell memory block. Floating gate transistors M0 through Mn-1 in each NAND string are serially connected between a corresponding string selection transistor SST and a corresponding ground selection transistor GST.

The device of FIG. 1 comprises a plurality of word lines WL0 through WLn-1 and selection lines GSL and SSL arranged in rows and connected to memory cell array 10. Word lines WL0 through WLn-1 are driven by row decoder 20. The device of FIG. 1 further comprises a plurality of bit lines BL0 through BLm-1 arranged in columns and connected to memory cell array 10. Bit lines BL0 through BLm-1 are driven by page buffer circuit 30. Each memory cell in memory cell array 10 stores one or more bits of data.

Memory cells that store more than one bit of data are commonly referred to as multi-level cells (MLCs). Examples of multi-level cells are described in a variety of sources, including for example, U.S. Pat. Nos. 6,122,188, 6,075,734, and 5,923,587, the respective disclosures of which are incorporated by reference. To briefly explain the function memory cells in a flash memory device, FIGS. 2 and 3 show threshold voltage distributions representing different logic states in flash memory cells. In particular, FIG. 2 illustrates threshold voltage distributions for 1-bit, 2-bit, and 4-bit multi level cells and FIG. 3 illustrates threshold voltage distributions for 1.5-bit, 2.5-bit, and 3-bit flash memory cells.

From FIGS. 2 and 3, it can be seen that flash memory cells are able to store data using different threshold voltage distributions. For instance, as shown in FIG. 2, a flash memory cell is able to store 1 bit of data using two threshold voltage distributions, 2 bits using 4 threshold voltage distributions, or 4 bits using 16 threshold voltage distributions. Similarly, as shown in FIG. 3, the flash memory cell is able to store 1.5 bits of data using 3 threshold voltage distributions, 2.5 bits using 6 threshold voltage distributions, and 3 bits using 8 threshold voltage distributions.

A NAND string typically comprises 16, 32, or 64 memory cells. In other words, in memory block 10 shown in FIG. 1, "n" is typically equal to 16, 32, or 64. Accordingly, a NAND string comprising flash memory cells such as those illustrated in FIG. 2 can store 16, 32, 64, 128, or 256 bits of data. In other words, where each NAND string in memory block 10 comprises 16, 32, or 64 memory cells, each storing 1, 2, or 4 bits of data, memory block 10 can store 16, 32, 64, 128, or 256 pages of data, where each page of data corresponds to "m" memory cells connected to the same word line. Similarly, a NAND string comprising flash memory cells such as those illustrated in FIG. 2 can typically store 24, 40, 48, 80, 96, 160, or 192 bits of data. In other words, memory block 10 can store 24, 40, 48, 80, 96, 160, or 192 pages of data using flash memory cells such as those illustrated in FIG. 3.

Nowadays, most manufacturers of flash memory devices produce the flash memory devices with memory cells adapted to store $2^n$ bits of data where "n" is an integer greater than or equal to 0. Accordingly, product specifications for flash memory devices and control schemes for associated file systems are typically defined with reference to flash memory cells adapted to store $2^n$ bits of data.

In general, program and read operations for NAND flash memory devices are carried out in page units. On the other hand, erase operations for NAND flash memory devices are typically carried out in units of several pages or entire memory blocks. As a result, where the number of pages in each memory block is not a power of two ($2^n$), but rather is a number such as 48, 80, 96, 192 or 384, conventional control schemes may not achieve desirable results. Accordingly, in order achieve compatibility between conventional flash memory devices including memory cells adapted to store different amounts of data, an additional file system control scheme or flash memory organization may be required. However, unfortunately including such additional features increases the cost of manufacturing the devices.

SUMMARY OF THE INVENTION

Accordingly, to address the foregoing problems of conventional systems, selected embodiments of the invention provide flash memory devices and related memory arrays including memory blocks capable of storing $2^n$ bits of data using different types of memory cells capable of storing different numbers of bits.

For example, according to one embodiment of the invention, a memory cell array comprises a plurality of memory blocks. Each memory block comprises a plurality of bit lines and a plurality of word lines, and a plurality of memory cells arranged at intersections between the plurality of bit lines and word lines. Each bit line is connected to at least two memory cells adapted to store different numbers of bits from each other.

According to another embodiment of the invention, a flash memory device comprises a page buffer circuit adapted to store data for read and write operations of the flash memory device, and a memory cell array. The memory cell array comprises a plurality of memory blocks, and each memory block comprises a plurality of bit lines and a plurality of word lines and a plurality of memory cells arranged at intersections between the plurality of bit lines and word lines. Each bit line is connected to at least two memory cells adapted to store different numbers of bits from each other.

BRIEF DESCRIPTION OF THE DRAWINGS

Embodiments of the invention are described in relation to the accompanying drawings. Throughout the drawings like reference numbers indicate like exemplary elements, components, and steps. In the drawings:

FIG. 5 is a table illustrating various specifications for composite NAND strings in accordance with selected embodiments of the present invention;

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

According to selected embodiments of the invention, a flash memory device comprises a plurality of memory cell arrays, wherein each memory cell array comprises a plurality of memory blocks. Each memory block comprises a plurality of bit lines and word lines and a plurality of memory cells arranged at intersections between the bit lines and the word lines. The data storage capacity of each memory block can be logically divided into a predetermined number of pages, wherein each page comprises a group of bits independently accessible from a plurality of memory cells connected to the same word line. More specifically, a page generally corresponds to a plurality of same level bits that can be independently accessed from memory cells connected to the same word line. For instance, if a word line in a memory block is connected to "m" memory cells each capable of storing two bits of data and connected to bit lines operating at the same time, the word line can be used to independently access two pages, each comprising "m" bits: one of the two pages comprises least significant bit (LSB) data, and the other one of the two pages comprises most significant bit (MSB) data. Alternatively, if the "m" 2-bit memory cells are connected to respective even and odd bit lines that are operated at different times, the word line can be used to access four pages: a LSB page connected to the even bit lines, a LSB page connected to the odd bit lines, a MSB page connected to the even bit lines, and a MSB page connected to the odd bit lines.

Each bit line in each memory block is coupled with at least two memory cells adapted to store a different number of bits from each other. For example, a bit line may be connected with one memory cell adapted to store one bit and another memory cell adapted to store two bits. However, the number of pages in each memory block is a power of two, e.g., 32, 64, 128, 256 etc., to ensure compatibility with conventional flash memory devices. As a result, flash memory devices according to selected embodiments of the present invention are compatible with control schemes and various circuit structures of conventional flash memory devices.

Figure 1:
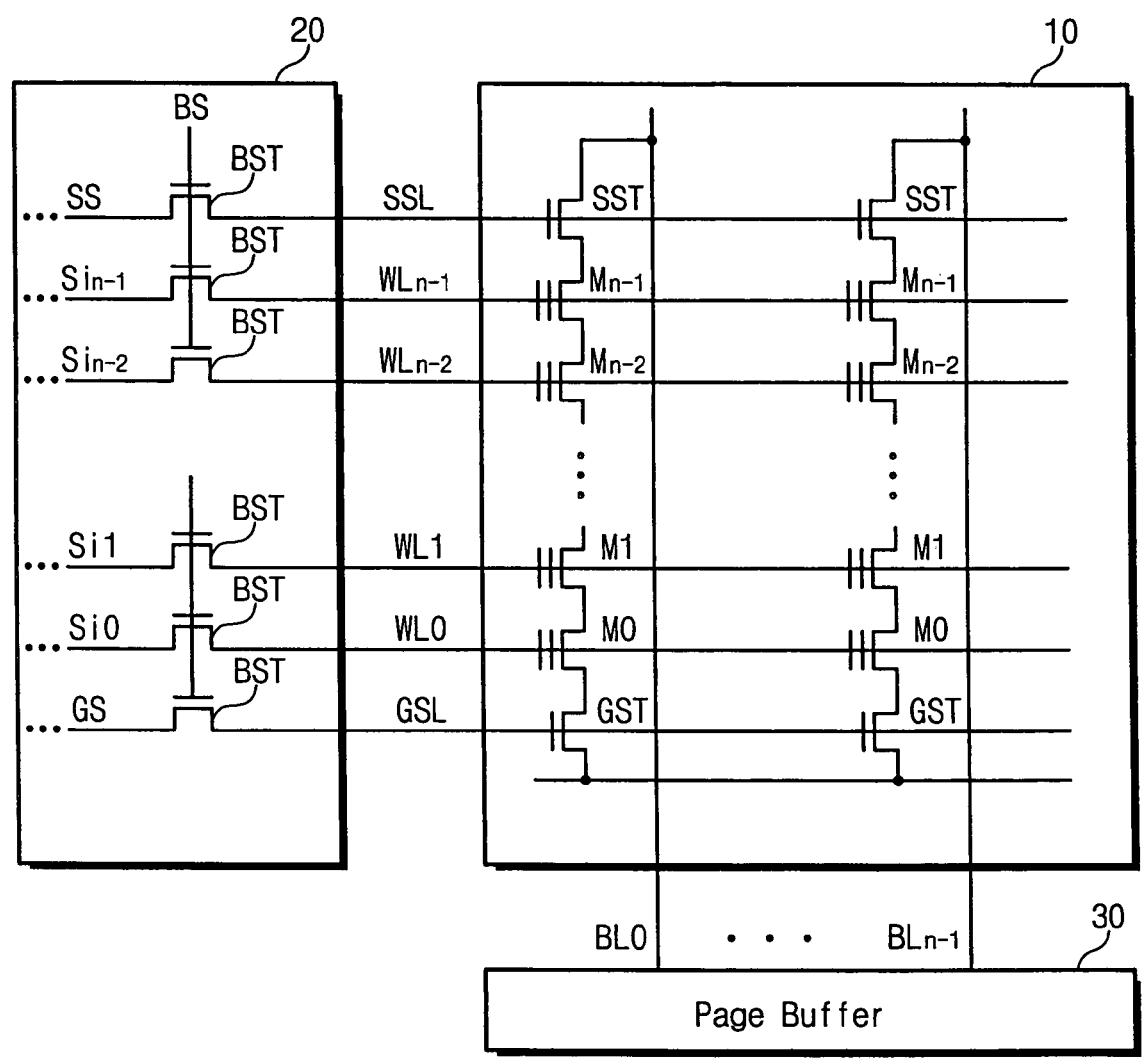
FIG. 1 is a memory block diagram illustrating a conventional flash memory device.
Figure 2:
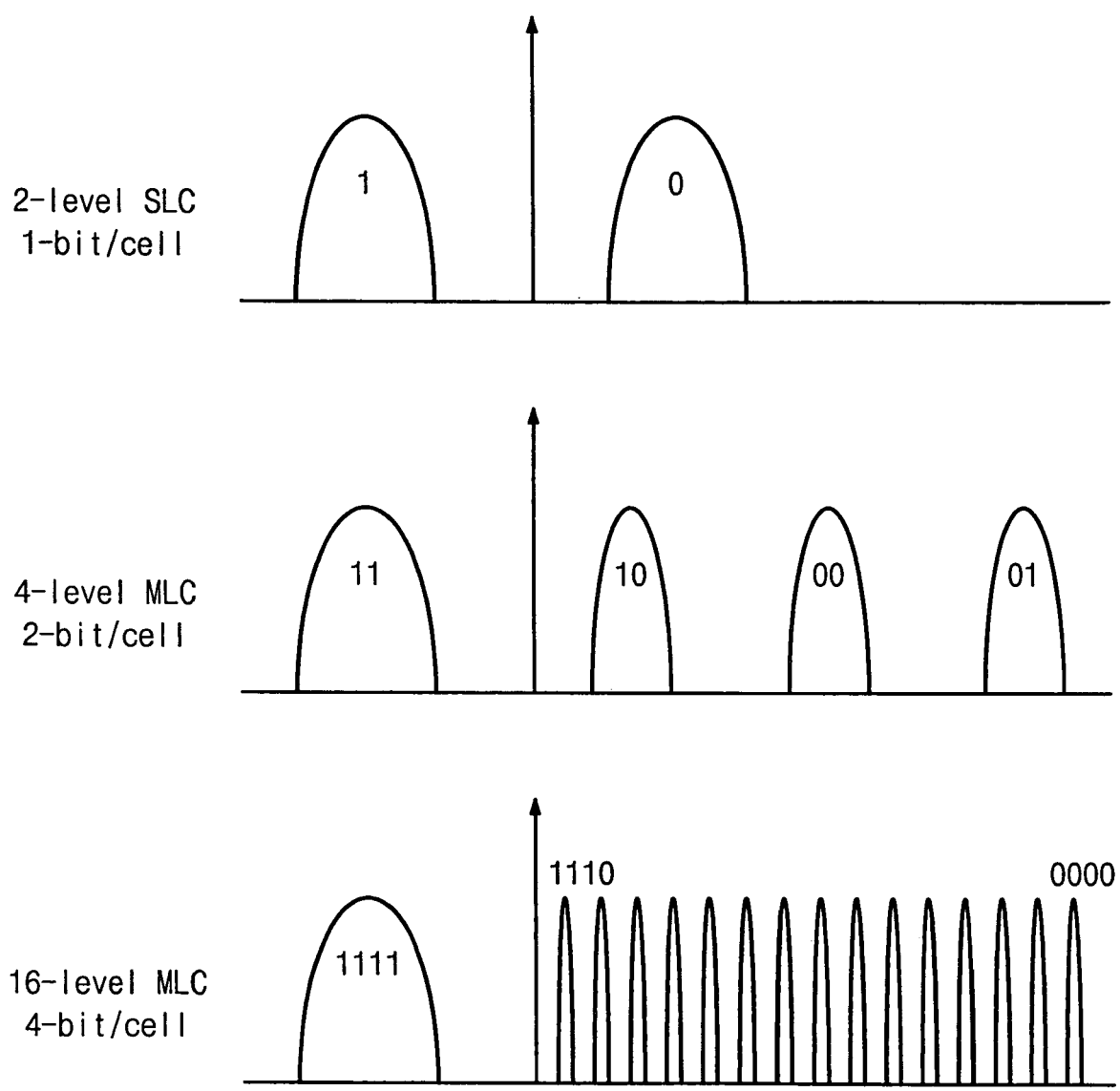
FIGS. 2 and 3 are threshold voltage distribution diagrams illustrating the data storage capabilities of single and multi-level flash memory cells.
Figure 3:
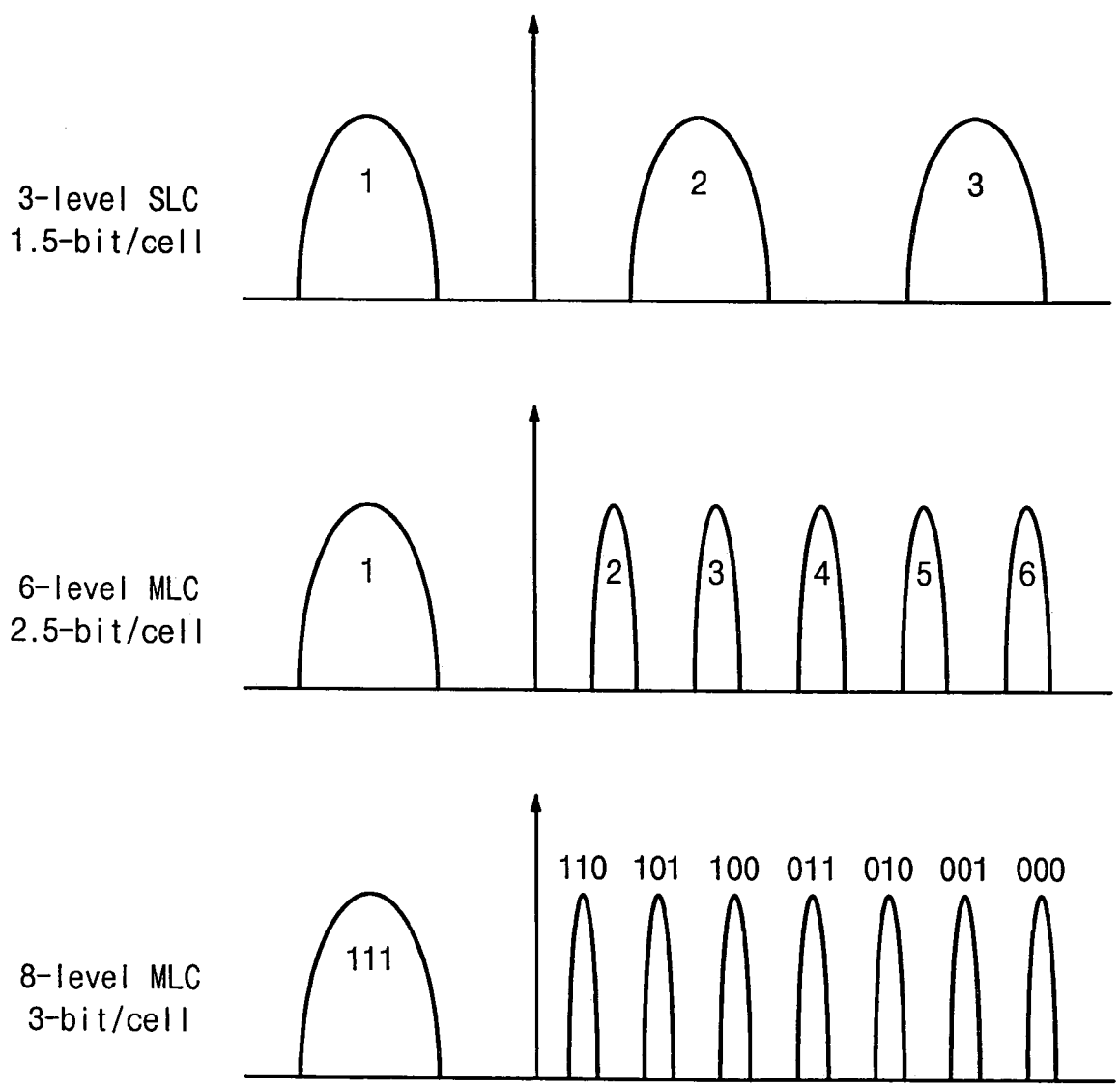
Figure 4:
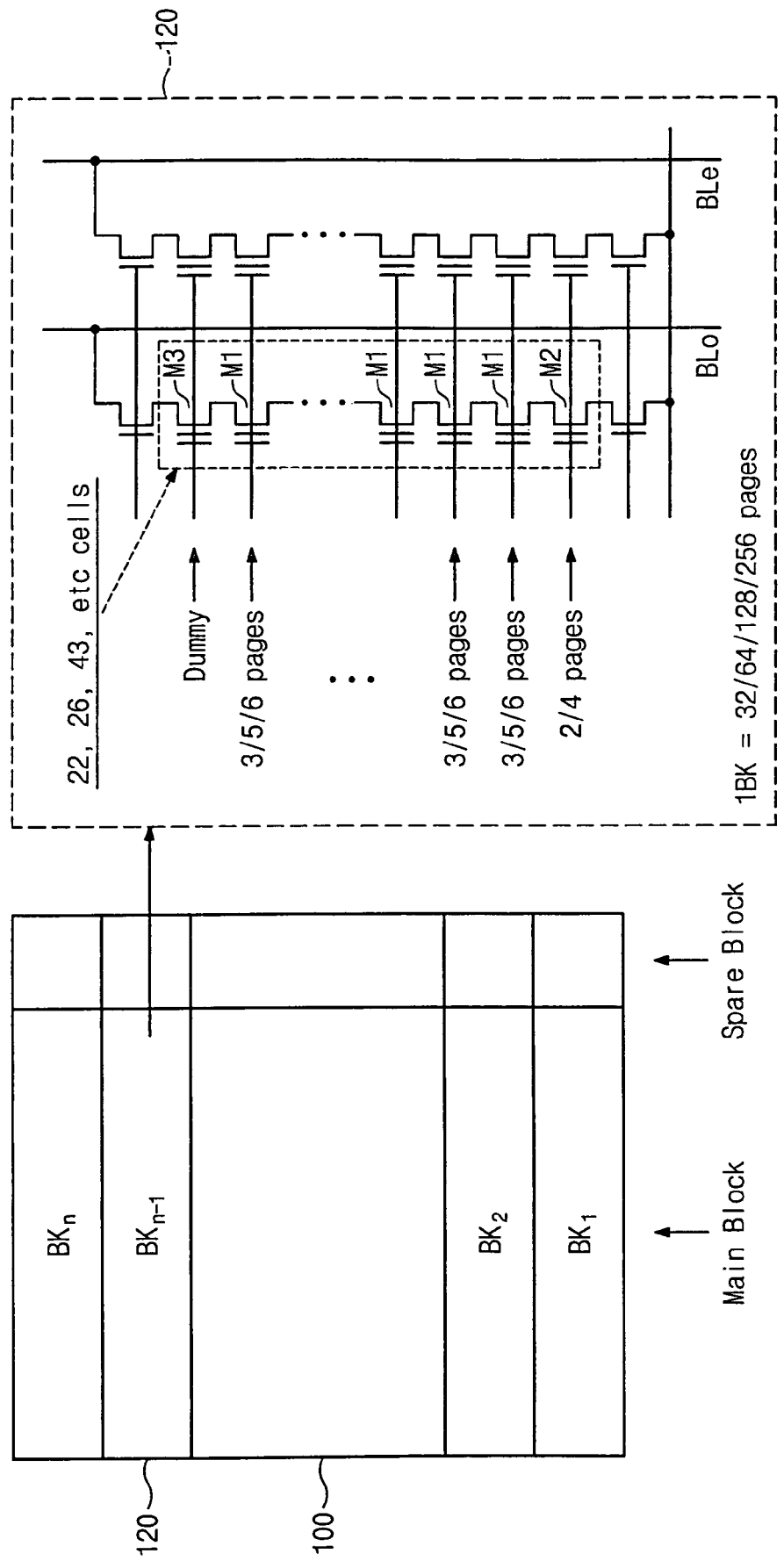
FIG. 4 is a memory block diagram illustrating a memory cell array for a flash memory device according to one embodiment of the invention.

FIG. 4 is a memory block diagram illustrating a memory cell array 100 for a flash memory device according to an embodiment of the present invention. In this example, memory cell array 100 comprises multi-level cell NAND flash memory cells; however, those skilled in the art will recognize that memory cell array 100 may comprise other types of memory cells. For instance, memory cell array 100 may alternatively comprise NOR flash memory cells.

Referring to FIG. 4, memory cell array 100 comprises a plurality of memory blocks BK1 through BKn. For explanation purposes, a single memory block 120 among memory blocks BK1 through BKn will be described. However, the operation of remaining memory blocks in memory cell array 100 is similar to the operation of memory block 120 and therefore additional explanations of the remaining memory blocks will be omitted to avoid redundancy. Memory block 120 comprises a number of pages equal to a power of two, e.g., 32, 64, 128, or 256 pages. Each page comprises 512 bytes of data.

Memory block 120 comprises a plurality of NAND strings arranged in a bit line direction. Each NAND string includes some number of memory cells, e.g., 22, 23, 43, 44, 53, etc. In addition, each NAND string comprises at least two memory cells capable of storing different numbers of bits. For instance, in FIG. 4, memory cells are labeled M1, M2, and M3 to denote different types capable of storing different numbers of bits. As an illustration, the memory cells labeled M1 may be capable of storing a number of bits not equal to a power of 2, e.g., 1.5, 2.5, or 3 bits. The memory cells labeled M2 may be capable of storing a number of bits equal to a power of two, e.g., 1 or 2 bits, and memory cells labeled M3 may be dummy cells not capable of storing any bits of data.

In this written description, a memory cell string including at least two memory cells capable of storing different numbers of bits will be referred to as a "composite memory cell string." Similarly, a NAND string including at least two memory cells capable of storing different numbers of bits will be referred to as a "composite NAND string," and a memory cell array formed of such composite memory cells strings such as composite NAND strings will be referred to as a "composite memory cell array."

As an example, FIG. 4 shows composite NAND strings including three types of memory cells—one-bit, two-bit, and three-bit memory cells. However, the number of different types of memory cells can be altered without departing from the scope of the invention. As an example, a composite NAND string may comprise main cells storing different numbers of bits, or main cells and dummy cells storing different number of bits, or both.

As illustrated in FIG. 4, each composite NAND string in memory block 120 is composed predominantly of memory cells labeled M1 and partially comprises memory cells labeled M2 and M3. For simplicity of explanation, the memory cells labeled M1 will be referred to as first type memory cells M1, the memory cells labeled M2 will be referred to as second type memory cells M2, and the memory cells labeled M3 will be referred to as third type memory cells M3. Typically, the second and third type memory cells M2 and M3 are disposed at positions of NAND strings where programming characteristics are weak.

As shown in FIG. 4, each memory block 120 comprises $2^n$ pages of data, where n is an integer greater than or equal to zero, e.g., 32, 64, 128, or 256. Memory block 120 comprises a plurality of composite NAND strings, where each composite NAND string comprises some number of memory cells, e.g., 22, 23, 43, 44, 45, 52, etc. Based on the number of bits stored in each memory cell, different word lines may be used to access to different numbers of pages. The total number of pages within memory block 120 can be determined by summing the pages accessible from each of the word lines.

As one example, where a word line is connected to memory cells of second type M2 adapted to store one bit of data, and the memory cells are divided into even and odd lines BLe and BLo, respectively, the word line can be used to access two pages: one page corresponding to memory cells connected to the even bit lines, and one page corresponding to memory cells connected to the odd bit lines. If the number of bits stored in each memory cell were to double, the number of pages accessible with the word line would double as well, for example, so that the word line could access four pages of data.

As another example, where a word line is connected to memory cells of first type M1 adapted to store 1.5 bits of data per memory cell and the memory cells connected to the word line are connected to respective even and odd bit lines, the word line can be used to access 3 pages of data because storing 1.5 bits of data per one memory cell is similar to storing 3 bits per 2 memory cells. Similarly, where the word line is connected to memory cells of first type M1 adapted to store 2.5 bits of data per cell and the memory cells are connected to respective even and odd bit lines, the word line can be used to access 5 pages of data. Likewise, where the word line is connected to memory cells of first type M1 adapted to store 3 bits of data per cell and the memory cells are connected to respective even and odd bit lines, the word line can be used to access 6 pages of data.

By allowing each word line in a memory block to access an appropriate number of pages, the total number of pages in the memory block can be maintained as a power of two, e.g., 32, 64, 128, or 256 pages. As mentioned previously, even though composite NAND strings include memory cells capable of storing different numbers of bits, the number of pages in a memory block containing the composite NAND strings can be maintained as a power of two. As a result, flash memory devices including the composite NAND strings may be operated with product specifications and control schemes compatible with conventional flash memory devices.

FIG. 5 is a table illustrating various specifications for composite NAND strings in accordance with selected embodiments of the present invention. FIGS. 6 through 15 are circuit diagrams illustrating the composite NAND strings implementing the specifications illustrated in the table of FIG. 5.

Figure 6:
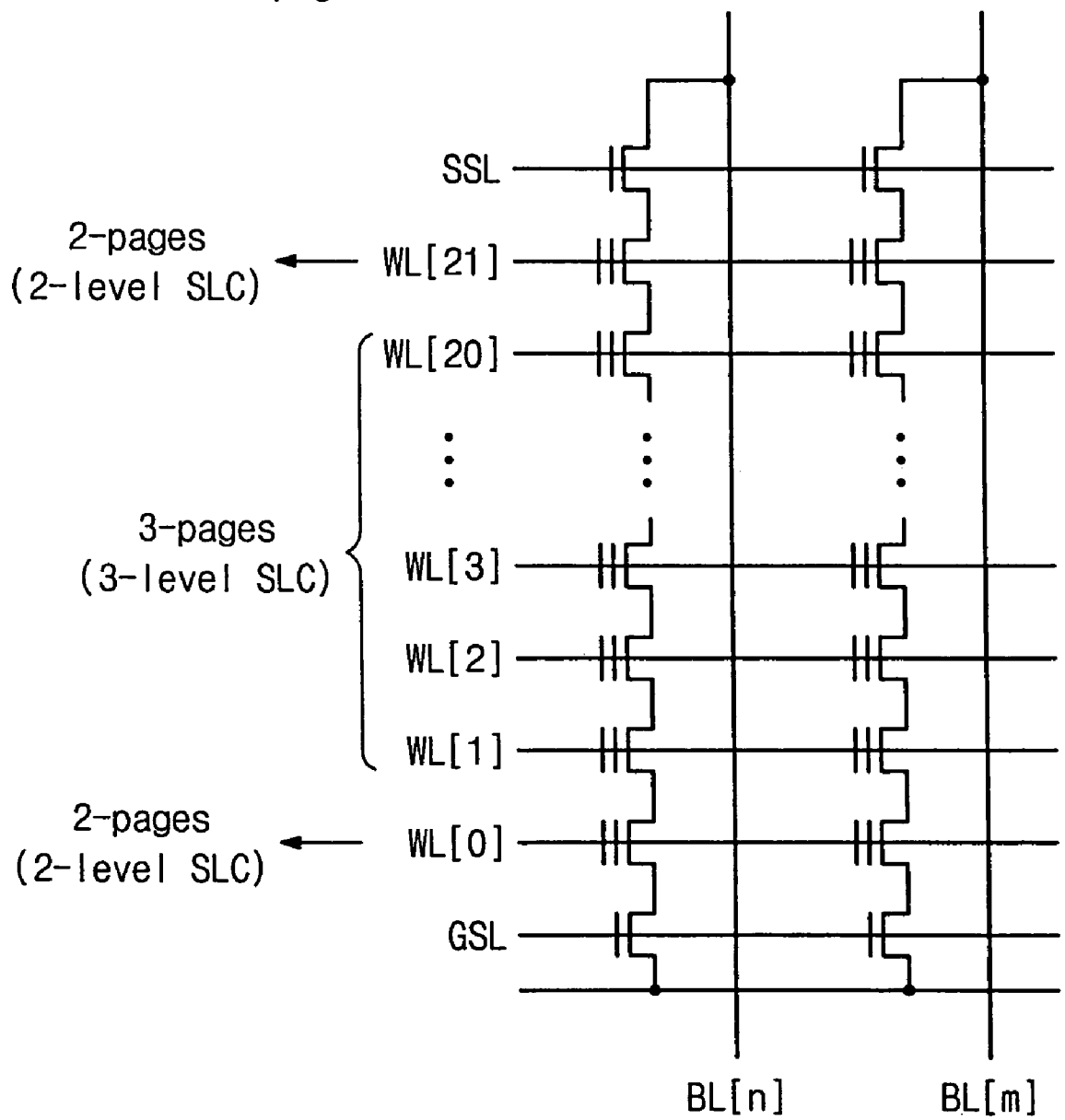
FIGS. 6 through 15 are circuit diagrams illustrating the composite NAND strings implementing the specifications illustrated in the table of FIG. 5.

Referring to FIG. 5, each memory block of the memory cell array is formed of 64, 128, or 256 pages. If one memory block is composed of 64 pages, each composite NAND string may be formed of 22 memory cells. FIG. 6 illustrates this corresponding structure of the composite NAND string.

Referring to FIGS. 5 and 6, where one memory block comprises 64 pages, each composite NAND string in the memory block comprises 22 memory cells, where 20 of the 22 memory cells are of first type M1 (e.g., 3-level SLC), each storing 1.5 bits of data and the remaining two memory cells among the 22 memory cells are of second type M2 (e.g., 2-level SLC) each storing 1 bit of data. A corresponding plurality of word lines WL[0] through WL[21] are respectively connected to the 22 memory cells. Among word lines WL[0] through WL[21], lowest and highest word lines WL[0] and WL[21], which tend to be relatively weak in programming characteristics, are coupled to the memory cells of second type M2 (e.g., 2-level SLC). The remaining word lines WL[1] through WL[20] are coupled to the memory cells of first type M1 (e.g., 3-level SLC). In this case, the word lines coupled to the memory cells of first type M1 have access to 3 pages and the word lines coupled to the memory cells of second type M2 have access to 2 pages. The number of pages that can be accessed by each word line is determined by the number of bits stored in each memory cell. The total number of pages in the memory block can be determined by summing the total number of pages that can be accessed by each word line in the memory block. For example, the total number of pages in a memory block formed of the composite NAND strings shown in FIG. 6 is 2WL×2Page+20WL×3Page=64.

Figure 7:
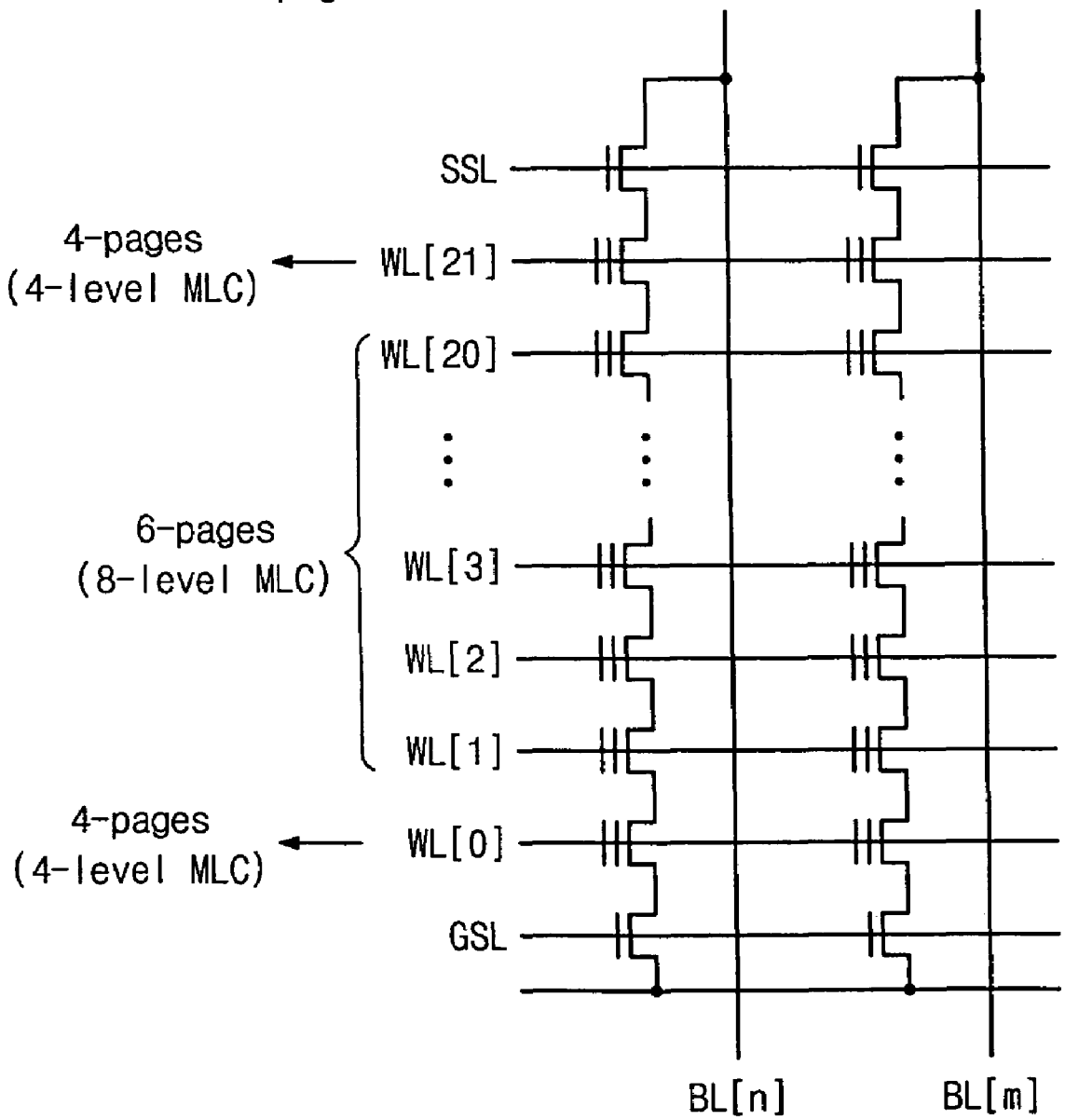

Based on the structure of the circuit diagram of FIG. 6, where the number of bits stored in the memory cells of first type M1 doubles from 1.5 bits to 3 bits and the number of bits stored in the memory cells of second type M2 doubles from 1 bit to 2 bits, the number of pages in the memory block also doubles from 64 to 128, as illustrated by the circuit diagram of FIG. 7.

Although the number of bits in each memory cell in the respective memory blocks of FIGS. 6 and 7 is not a power of two, the total number of pages in the memory blocks is a power of two. Accordingly, the memory blocks illustrated in FIGS. 6 and 7 are compatible with the control schemes, file systems, and various circuit structures of conventional flash memory devices.

Returning to FIG. 5, there are many possible patterns for composite NAND strings in a memory block having 128 pages, besides the example illustrated in FIG. 7. For instance, where one memory block comprises 128 pages, each composite NAND string may be formed of 26, 43, 44, or 45 memory cells. Examples of circuits having composite NAND strings with these different numbers of memory cells are illustrated in FIGS. 8, 9, 10, and 11.

Figure 8:
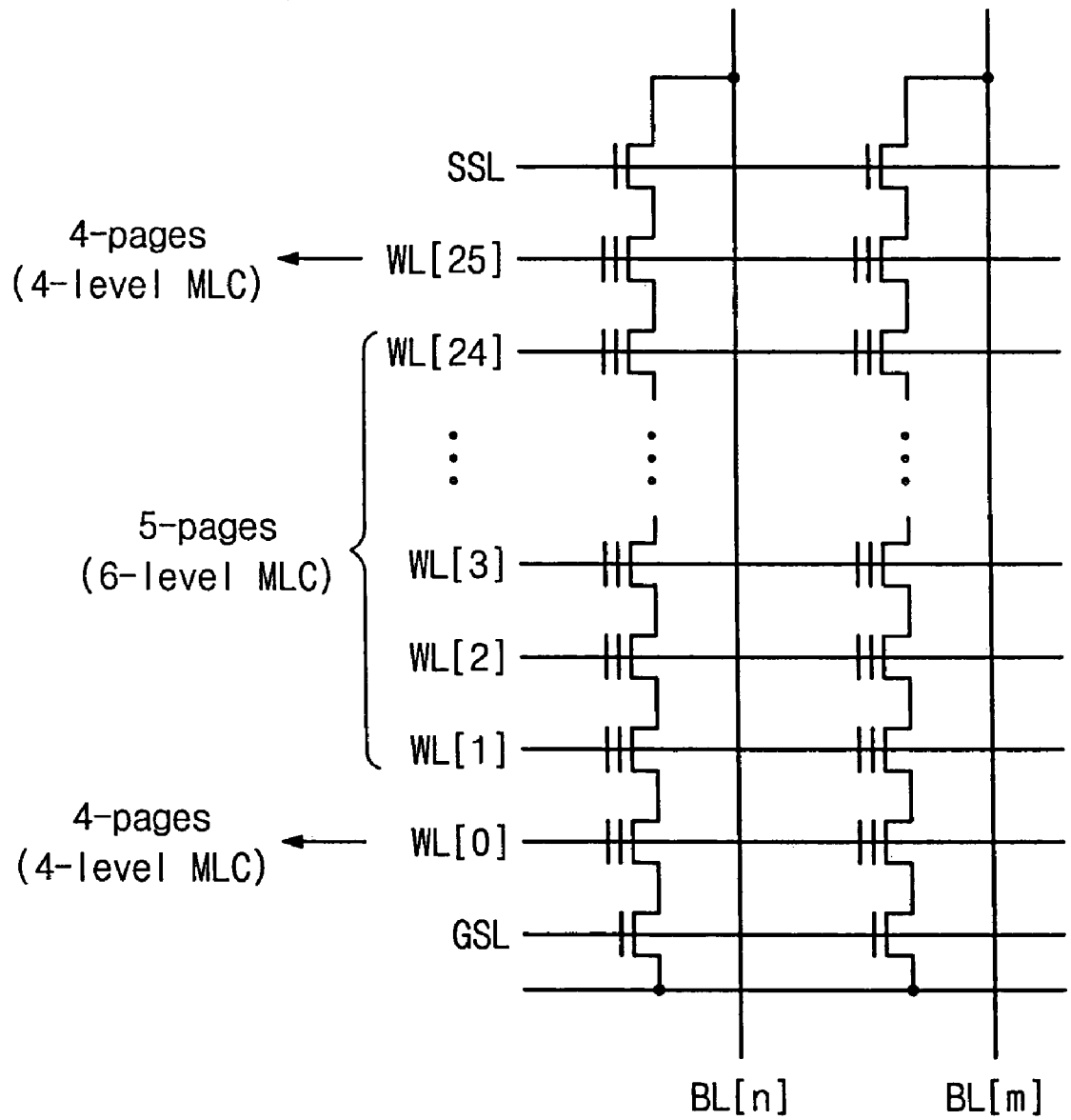

Referring to FIGS. 5 and 8, where one memory block comprises 128 pages and one composite NAND string comprises 26 memory cells, 24 memory cells may be formed of memory cells of first type M1 each adapted to store 2.5 bits of data. The remaining two of 26 memory cells may be formed of memory cells of second type M2 each storing 1 bit of data. The 26 memory cells are respectively connected to 26 word lines WL[0] through WL[25]. Among word lines WL[0] through WL[25], first and last word lines WL[0] and WL[25] having relatively weak programming characteristics are coupled to memory cells of second type M2. Remaining word lines WL[1] through WL[24] are coupled to memory cells of first type M1. Word lines WL[1] through WL[24] coupled to memory cells of first type M1 are capable of accessing 5 pages, while word lines WL[0] and WL[25] coupled to memory cells of second type M2 are capable of accessing 4 pages. The total number of pages assigned to the memory block formed of the composite NAND strings shown in FIG. 8 is 2WL×4Page+24WL×5Page=128.

Figure 9:
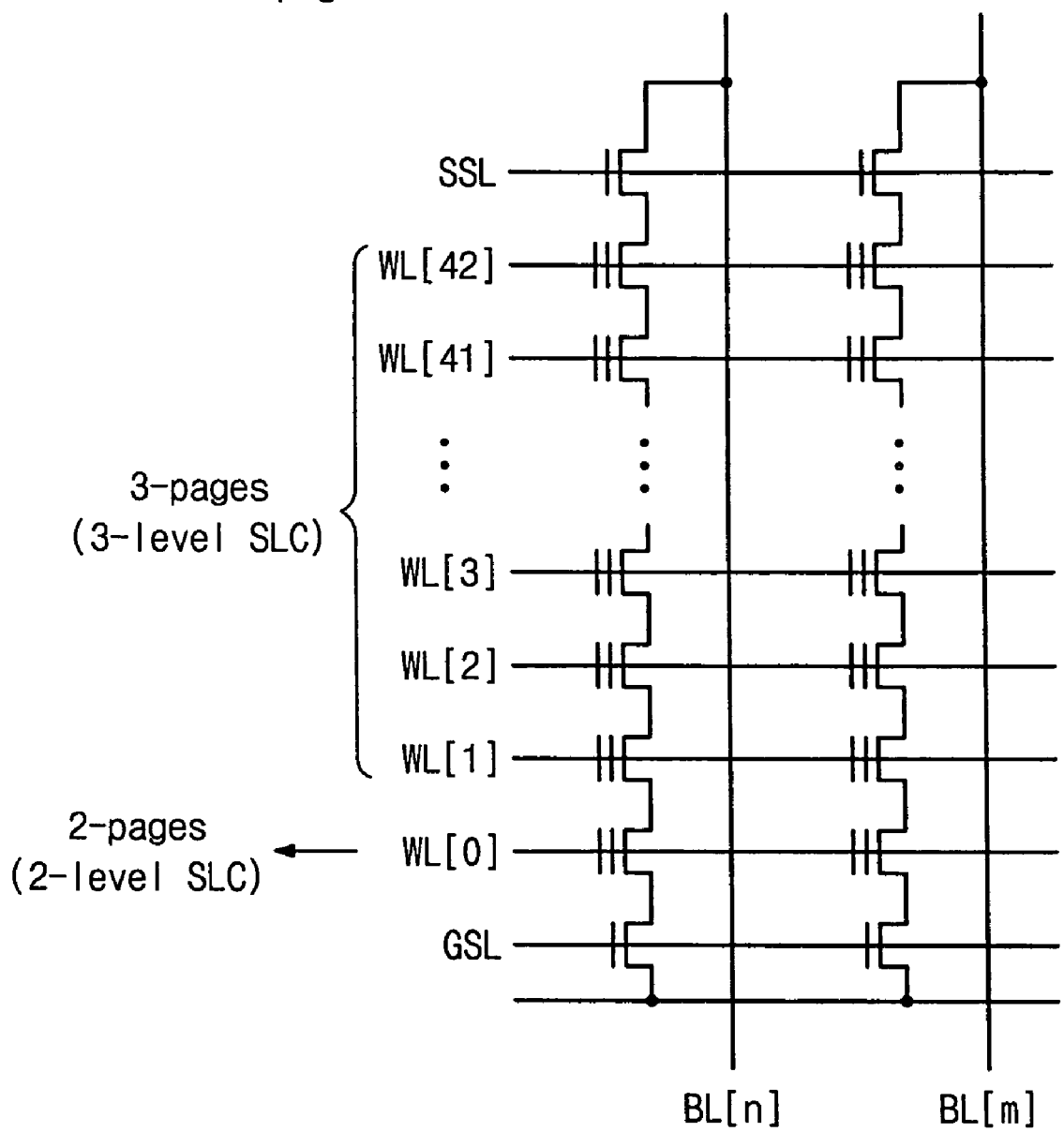

Referring to FIGS. 5 and 9, where one memory block comprises 128 pages and one composite NAND string comprises 43 memory cells, 42 memory cells may be formed of memory cells of first type M1 (e.g., 3-level SLC) each adapted to store 1.5 bits of data. The remaining one of the 43 memory cells may be formed of a memory cell of second type M2 (e.g., 2-level SLC) adapted to store 1 bit of data. In the memory block of FIG. 9, a word line WL[0] is connected to the memory cell of second type M2 and word lines WL[1] through WL[42] are connected to remaining memory cells, which have first type M1. Accordingly, the total number of pages in the memory block of FIG. 9 is 1WL×2Page+42WL×3Page=128.

Figure 10:
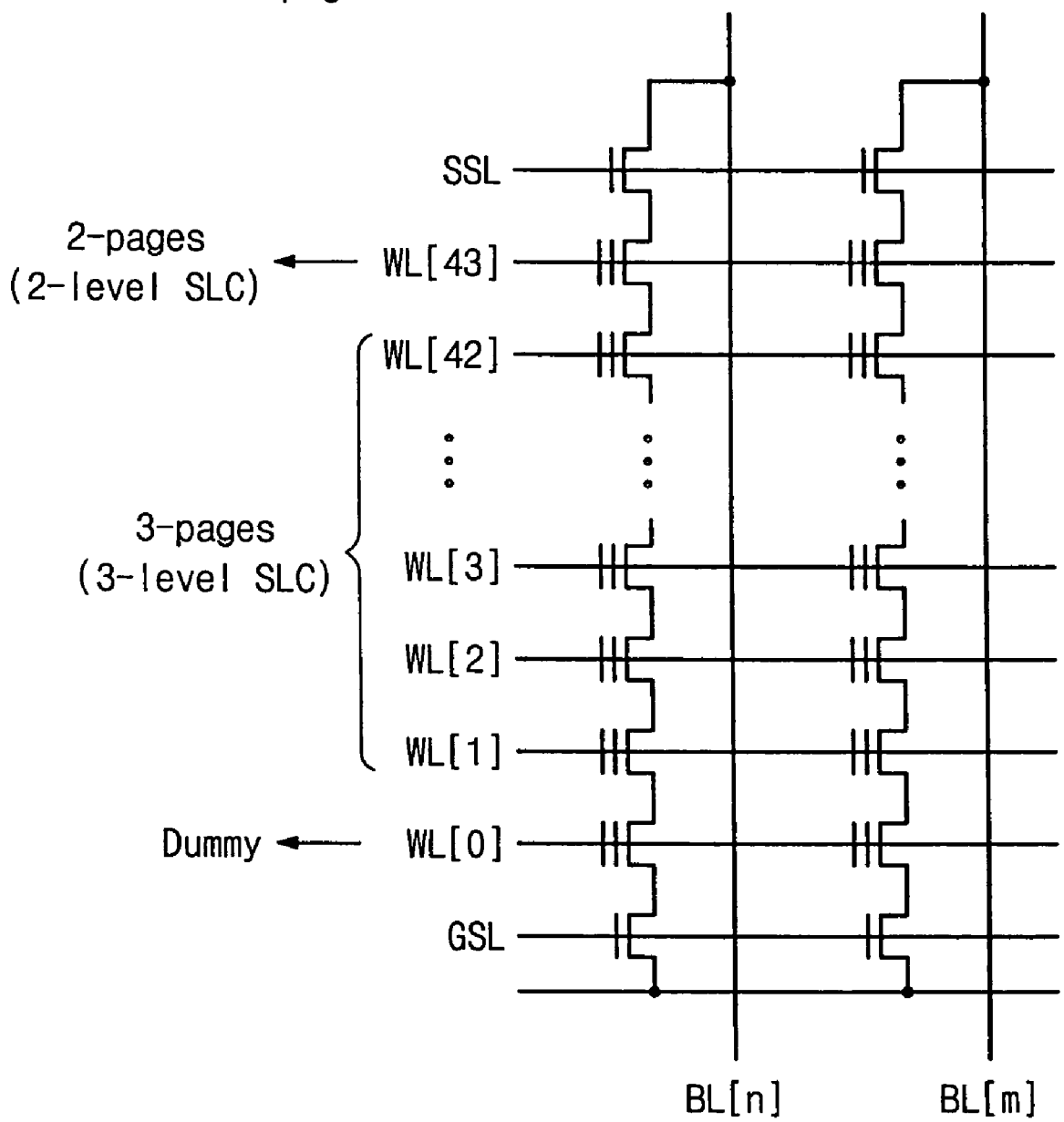

Referring to FIGS. 5 and 10, a memory block comprising 128 pages includes composite NAND strings each comprising 44 memory cells, where 42 memory cells have first type M1 (e.g., 3-level SLC) and are adapted to store 1.5 bits of data. Two remaining memory cells among the 44 memory cells include one memory cell of second type M2 (e.g., 2-level SLC) adapted to store one bit of data and a dummy cell. The dummy cell is connected to a word line WL[0], the memory cell with second type M2 is connected to a word line WL[43], and memory cells with first type M1 are connected to respective word lines WL[1] through WL[42].

The memory block of FIG. 10 similar to the memory block of FIG. 9, except that in the memory block of FIG. 10, the memory cell of first type M1 is connected to word line WL[43] and the dummy cell is connected to word line WL[0]. Like the memory block of FIG. 9, the memory block of FIG. 10 comprises composite NAND strings and a number of pages computed as 1WL×2Page+42WL×3Page+1WL×0Page=128.

Figure 11:
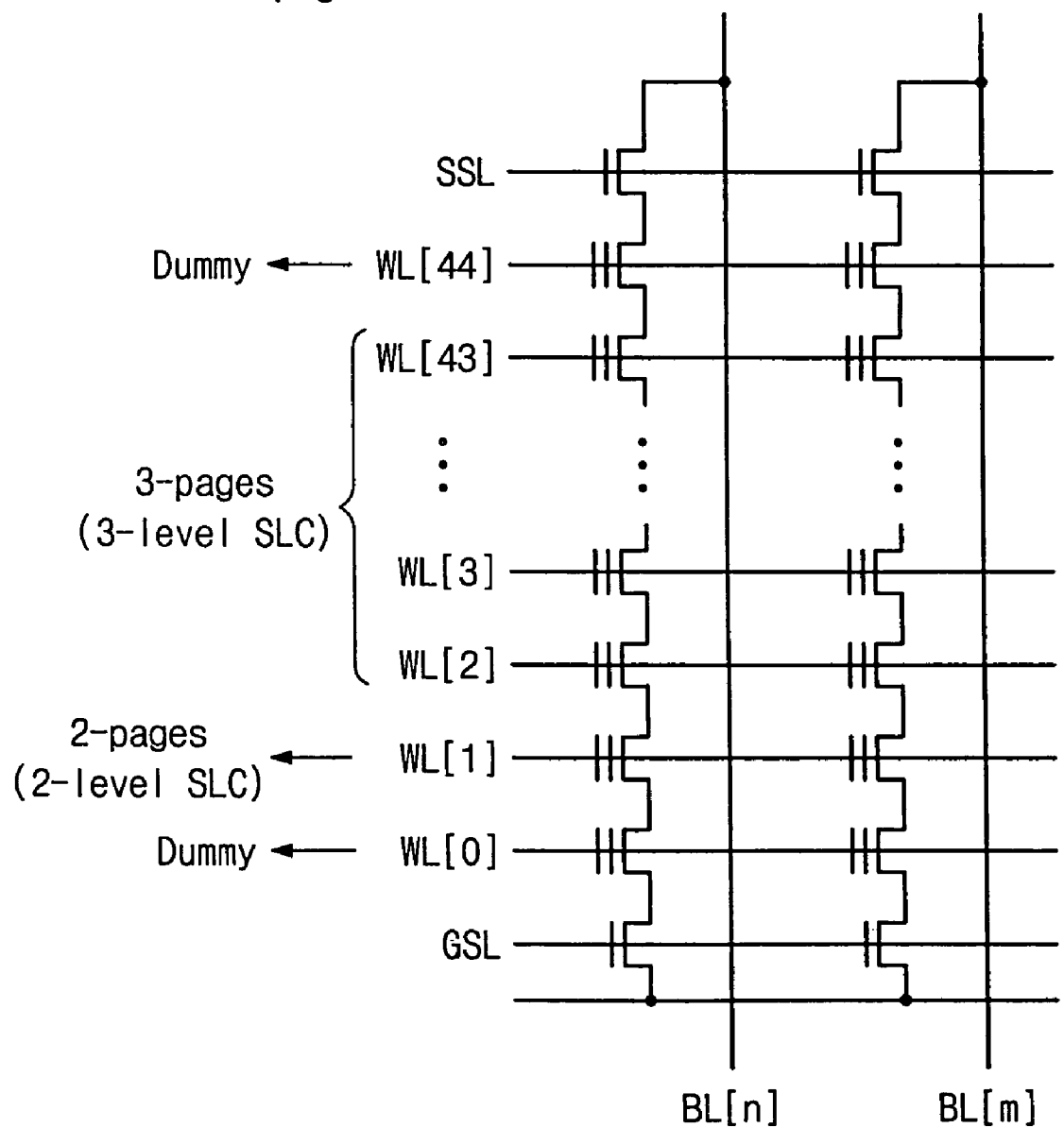

Referring to FIGS. 5 and 11, a memory block comprises 128 pages. The memory block includes a plurality of composite NAND strings each comprising 45 memory cells, where 42 of the 45 memory cells have first type M1 (e.g., 3-level SLC) each adapted to store 1.5 bits of data, one of the 45 memory cells has second type M2 (e.g., 2-level SLC) and is adapted to store 1 bit of data, and a remaining two of the 45 memory cells are dummy cells. The position of the memory cell of second type M2 can be swapped with the position of either of the dummy cells. Aside from the addition of the dummy cells, the memory block of FIG. 11 is substantially the same as the memory block of FIG. 9. The total number of pages in the memory block of FIG. 11 can be computed as 1WL×2Page+42WL×3Page+2WL×0Page=128.

As can be seen from FIGS. 9 through 11, the number of memory cells of second type M2 and the number of dummy cells in the memory block can be varied while maintaining the total number of memory cells in the memory block as a power of 2. In general, each composite NAND string in FIGS. 9 through 11 comprises mostly memory cells of first type M1. Memory cells of second or third type M2 or M3 are generally located at positions having relatively weak electrical characteristics. The positions and numbers of the dummy cells and the memory cells of second type M2 are provided as examples, and can be varied or modified.

With the structures of FIGS. 9, 10, and 11, where the number of bits stored in memory cells of first type M1 increases from 1.5 bits to 3 bits and the number of bits stored in memory cells of second type M2 doubles from 1 bit to 2 bits, the number of pages constituting one memory block doubles from 128 to 256. Circuit structures corresponding to cases where the capacity of each memory cell in FIGS. 9 through 11, respectively, are doubled, are shown in respective FIGS. 13, 14, and 15.

Figure 12:
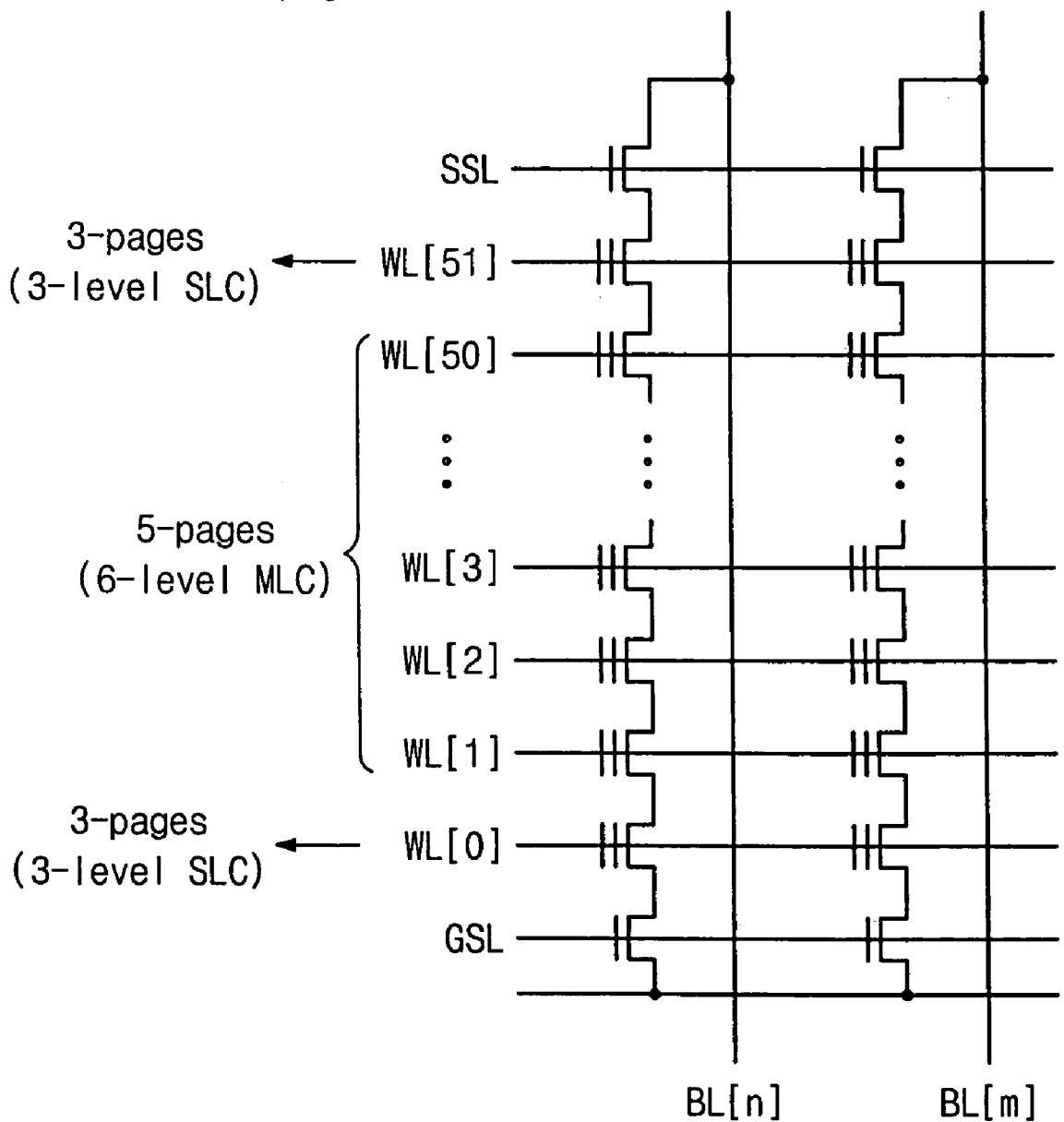
Figure 13:
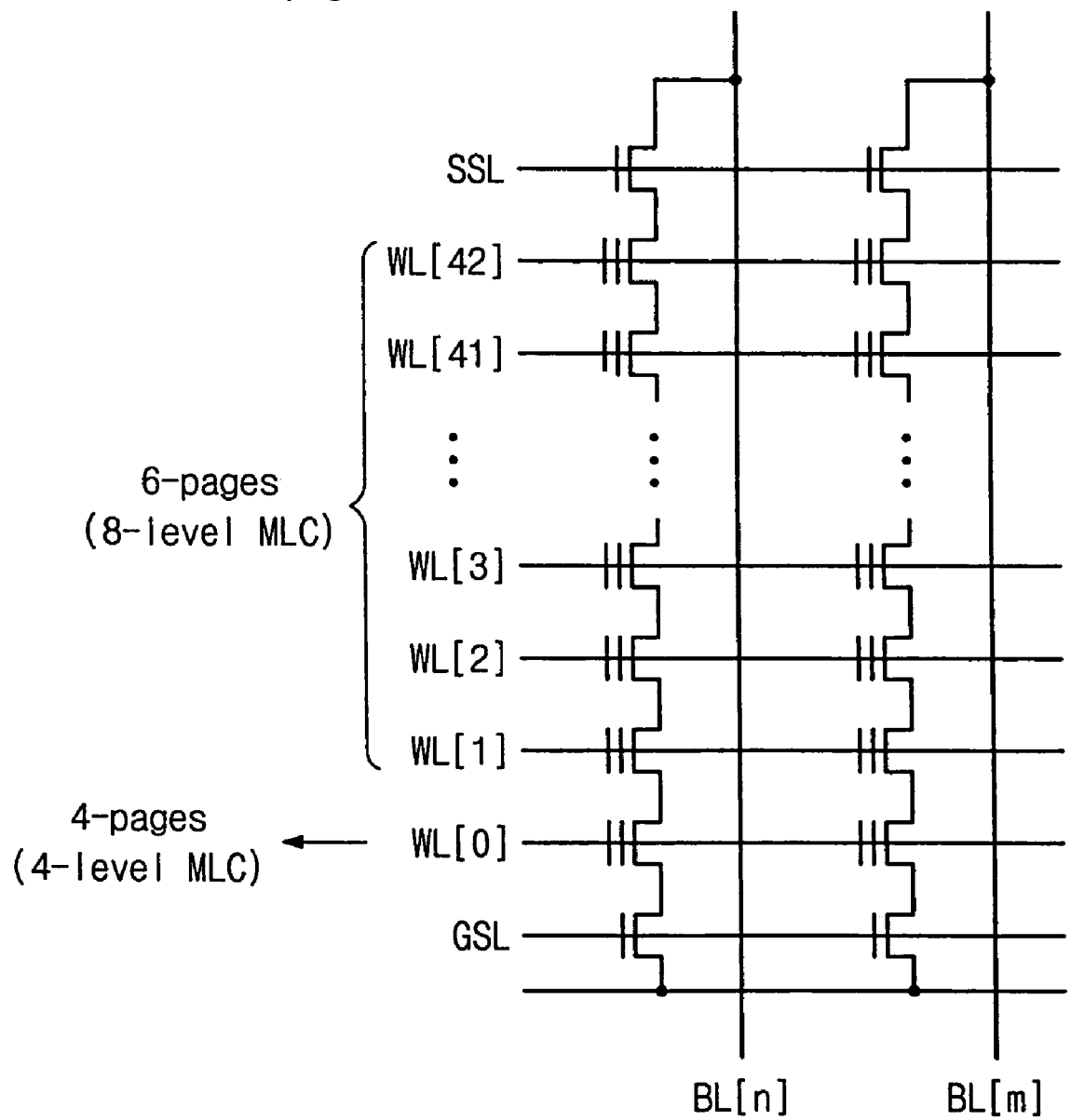
Figure 14:
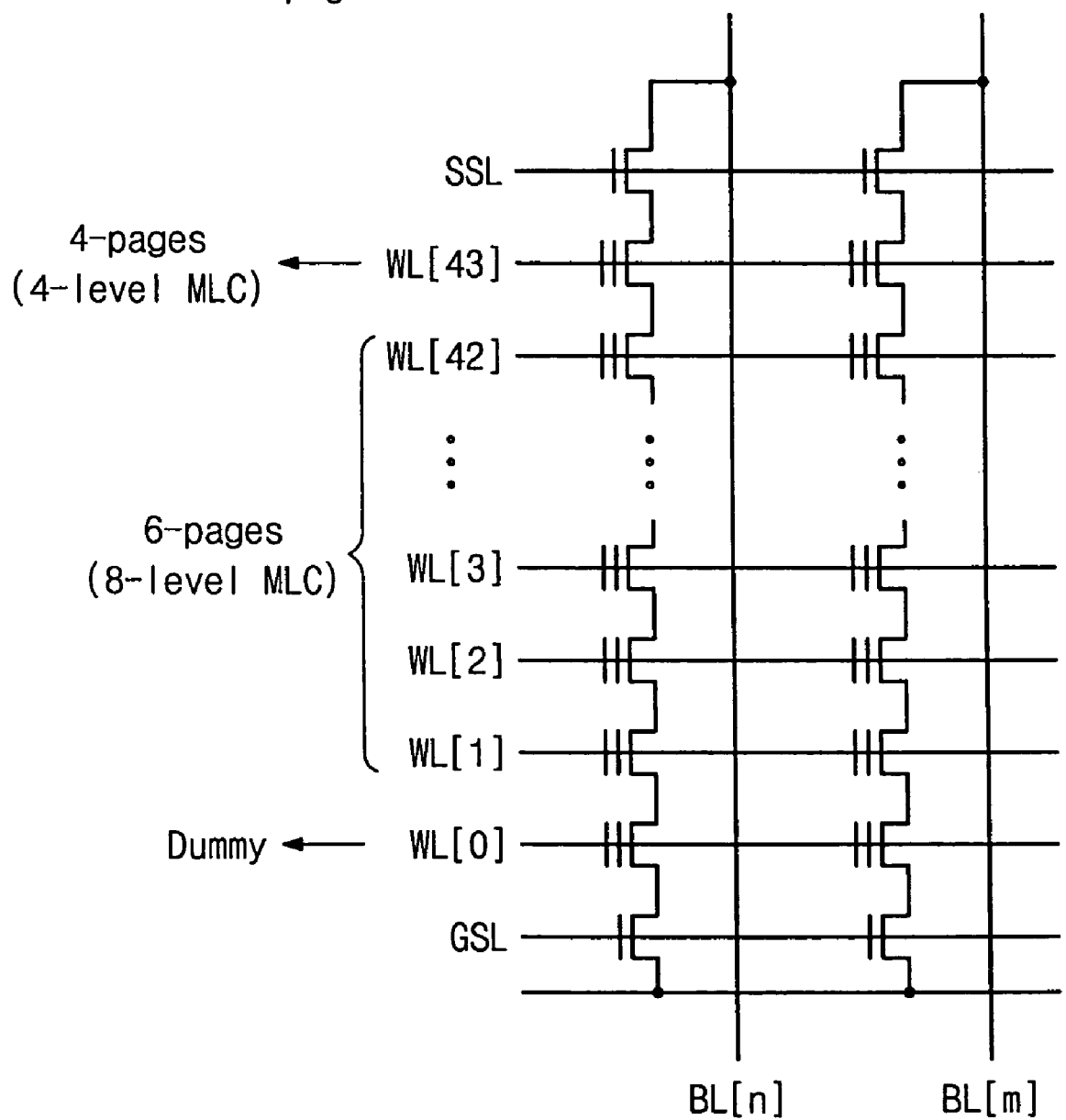
Figure 15:
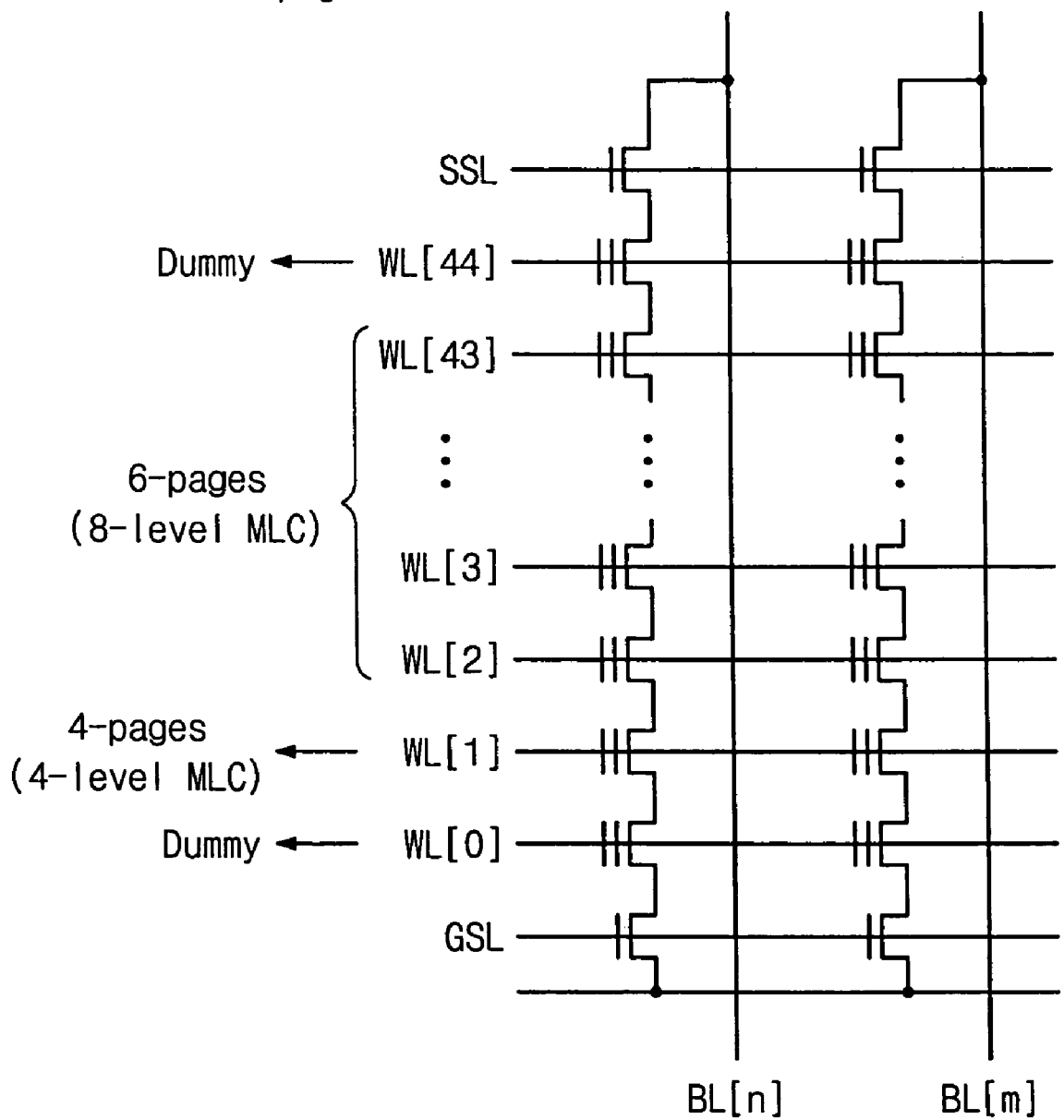

Many different patterns of composite NAND strings can be used to form a memory block with 256 pages besides those shown in FIGS. 13, 14, and 15. For instance, each composite NAND string may be formed of 52 memory cells as illustrated by FIG. 12.

Referring to FIGS. 5 and 12, a memory block comprises 256 pages. The memory block comprises a plurality of composite NAND strings, each including 52 memory cells, where 50 of the 52 memory cells are first type M1 (e.g., 6-level MLC) each storing 2.5 bits of data and two remaining memory cells are of first type M1 (e.g., 3-level MLC) each storing 1.5 bits of data. The total number of pages in the memory block of FIG. 12 can be computed as 2WL×3Page+50WL×3Page=256. As illustrated by FIG. 12, it is possible to form a memory block with composite NAND strings including all memory cells of first type M1, but with different memory cells in each composite NAND string capable of storing different numbers of bits.

The structure and composition of the composite NAND strings in the memory block of FIG. 12 can be modified or altered in various ways. For example, the number of memory cells in each composite NAND string and the number of bits stored by memory cells in each composite NAND string can be varied while still maintaining the total number of pages in the memory block as a power of two. Moreover, within a memory array, different memory blocks can be formed with different numbers of pages while still maintaining the number of pages in each memory block as a power of two.

In addition, memory cell arrays including composite NAND strings according to selected embodiments of the invention are not always required to be designed with a fixed number of pages. For example, the number of pages in a memory block may be changed in accordance with a user requirement, as explained below.

Figure 16:
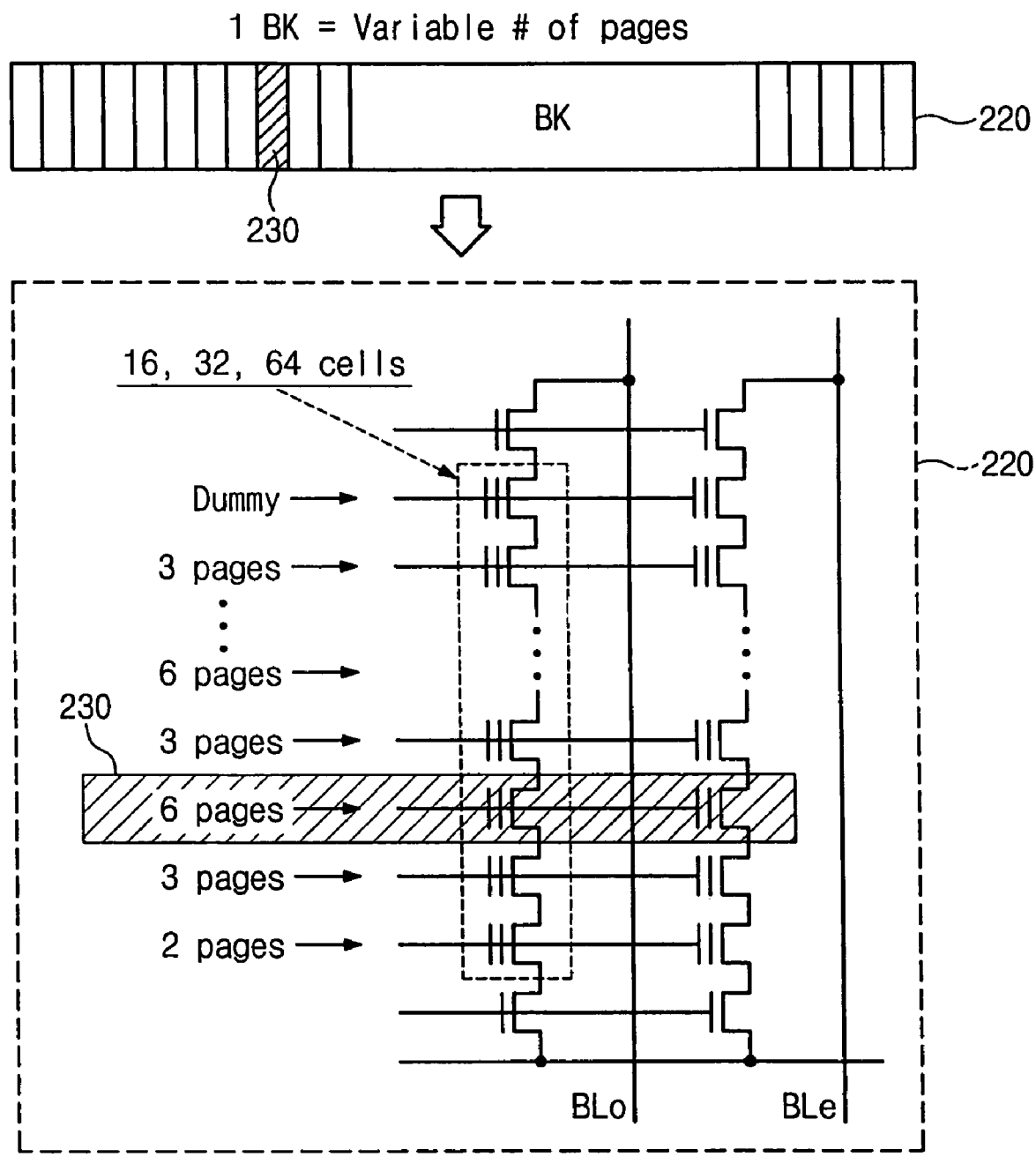
FIG. 16 is a memory block diagram illustrating a memory cell array for a flash memory device according to another embodiment of the invention.

FIG. 16 exemplarily shows a memory block 220 containing composite NAND strings according to another embodiment of the invention. Referring to FIG. 16, memory block 220 comprises a plurality of composite NAND strings, and each of the plurality of composite NAND strings contains a number of memory cells equal to a power of two, e.g., 16, 32, or 64 memory cells. Each composite NAND string in memory block 220 also comprises memory cells adapted to store different numbers of bits. Various different combinations of different types of memory cells may be used to form memory block 220 as illustrated, for example, by the table in FIG. 5.

Memory block 120 shown in FIGS. 4 through 15 may contain variable numbers and types of memory cells as long as the total number of pages in memory block 120 is equal to a power of two. Similarly, memory block 220 shown in FIG. 16 may contain variable numbers and types of memory cells that can be adjusted by a user as long as the total number of pages in memory block 220 is equal to a power of two. Accordingly, memory block 220 can provide a memory cell array structure with various patterns in accordance with various user requirements.

The exemplary embodiments described above are teaching examples. Those of ordinary skill in the art will understand that various changes in form and details may be made to the exemplary embodiments without departing from the scope of the invention as defined by the claims. For example, various embodiments of the invention may be adapted to function in NOR flash memory devices. In the NOR flash memory device, each memory block is not formed of a composite NAND string. However, each memory block (or sector) of the NOR flash memory device may be formed with a pattern of different types and numbers of memory cells, similar to the above-described NAND flash memory devices. For instance, bit lines arranged in memory blocks of the NOR flash memory device may be coupled to at least two different types of memory cells.

Due to various features provided by embodiments of the invention, memory cells adapted to store different numbers of bits can be combined to form a memory block having a number of pages equal to a power of two. Such memory blocks can be formed even where the number of bits stored by each memory cell is not a power of two.

As a result, a composite memory cell array including at least two types of memory cells, and a flash memory device comprising such a composite memory device can use conventional control schemes and/or file systems without changing peripheral circuits, a control scheme of a file system, or memory block size. Further, the composite memory cell array, and flash memory devices including the composite memory cell array, have compatibility with conventional flash memory devices.

What is claimed:

1. A memory cell array, comprising:
   a plurality of memory blocks, wherein each memory block comprises:
   a plurality of bit lines and a plurality of word lines; and
   a plurality of memory cells arranged at intersections between the plurality of bit lines and word lines;
   wherein each bit line is connected to at least two memory cells adapted to store different numbers of bits from each other.

2. The memory cell array of claim 1, wherein each of the plurality of memory blocks comprises $2^n$ pages, where n is an integer greater than or equal to 2.

3. The memory cell array of claim 1, wherein a particular memory block among the plurality of memory blocks contains a plurality of pages and the number of pages in the particular memory block is computed by summing a number of pages that can be accessed using each of the plurality of word lines in the particular memory block.

4. The memory cell array of claim 1, wherein one or more bit lines in one or more of the plurality of memory blocks is coupled to at least one memory cell adapted to store $2^n$ bits of data, where n is an integer greater than or equal to zero.

5. The memory cell array of claim 1, wherein one or more bit lines in one or more of the plurality of memory blocks is coupled to a memory cell adapted to store a number of bits that is not a power of two.

6. The memory cell array of claim 1, wherein one or more bit lines in one or more of the plurality of memory blocks is coupled to at least one dummy cell.

7. The memory cell array of claim 1, wherein each bit line in a particular memory block among the plurality of memory blocks is coupled to $2^n$ memory cells, where n is an integer greater than or equal to zero, and the number of pages in the particular memory block can be varied in accordance with a number of bits to be stored in each of the $2^n$ memory cells.

8. The memory cell array of claim 1, wherein each of the plurality of memory blocks contains the same number and arrangement of memory cells, and respectively corresponding memory cells within each of the plurality of memory blocks are adapted to store the same number of bits.

9. The memory cell array of claim 1, wherein the plurality of memory cells are NAND flash memory cells.

10. The memory cell array of claim 1, wherein the plurality of memory cells in each memory block are arranged into a plurality of composite NAND strings each including at least two memory cells adapted to store different numbers of bits from each other;
    wherein each of the composite NAND strings corresponds to one among the plurality of bit lines.

11. The memory cell array of claim 1, wherein the plurality of memory cells are NOR flash memory cells.

12. A flash memory device, comprising:
    a page buffer circuit adapted to store data for read and write operations of the flash memory device; and
    a memory cell array, comprising:
    a plurality of memory blocks, wherein each memory block comprises:
    a plurality of bit lines and a plurality of word lines; and
    a plurality of memory cells arranged at intersections between the plurality of bit lines and word lines;
    wherein each bit line is connected to at least two memory cells adapted to store different numbers of bits from each other.

13. The device of claim 12, wherein each of the plurality of memory blocks comprises $2^n$ pages, where n is an integer greater than or equal to 2.

14. The device of claim 12, wherein a particular memory block among the plurality of memory blocks contains a plurality of pages and the number of pages in the particular memory block is computed by summing a number of pages that can be accessed using each of the plurality of word lines in the particular memory block.

15. The device of claim 12, wherein one or more bit lines in one or more of the plurality of memory blocks is coupled to at least one memory cell adapted to store $2^n$ bits of data, where n is an integer greater than or equal to zero.

16. The device of claim 12, wherein one or more bit lines in one or more of the plurality of memory blocks is coupled to a memory cell adapted to store a number of bits that is not a power of two.

17. The device of claim 12, wherein one or more bit lines in one or more of the plurality of memory blocks is coupled to at least one dummy cell.

18. The device of claim 12, wherein each bit line in a particular memory block among the plurality of memory blocks is coupled to $2^n$ memory cells, where n is an integer greater than or equal to zero, and the number of pages in the particular memory block can be varied in accordance with a number of bits to be stored in each of the $2^n$ memory cells.

19. The device of claim 12, wherein each of the plurality of memory blocks contains the same number and arrangement of memory cells, and respectively corresponding memory cells within each of the plurality of memory blocks are adapted to store the same number of bits.

20. The device of claim 12, wherein the plurality of memory cells are NAND flash memory cells.

21. The device of claim 12, wherein the plurality of memory cells in each memory block are arranged into a plurality of composite NAND strings each including at least two memory cells adapted to store different numbers of bits from each other;
    wherein each of the composite NAND strings corresponds to one among the plurality of bit lines.

22. The device of claim 12, wherein the plurality of memory cells are NOR flash memory cells.

* * * * *